United States Patent
Nam et al.

(10) Patent No.: US 6,835,970 B2
(45) Date of Patent: Dec. 28, 2004

(54) SEMICONDUCTOR DEVICE HAVING SELF-ALIGNED CONTACT PADS AND METHOD FOR MANUFACTURING THE SAME

(75) Inventors: Dong-seok Nam, Seoul (KR); Ji-soo Kim, Youngin (KR); Yun-sook Chae, Suwon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 16 days.

(21) Appl. No.: 10/087,063

(22) Filed: Mar. 1, 2002

(65) Prior Publication Data

US 2003/0032219 A1 Feb. 13, 2003

(30) Foreign Application Priority Data

Aug. 13, 2000 (KR) ........................................ 2001-48740

(51) Int. Cl.⁷ ..................... H01L 27/10; H01L 21/8238
(52) U.S. Cl. ............... 257/202; 257/211; 257/311; 257/316; 438/229; 438/299; 438/303; 438/586; 438/587
(58) Field of Search ................................ 438/229, 299, 438/303, 586, 587, 597; 257/202, 311, 211, 316, 296

(56) References Cited

U.S. PATENT DOCUMENTS

| | | | | |
|---|---|---|---|---|
| 6,080,624 A | * | 6/2000 | Kamiya et al. | 438/257 |
| 6,174,767 B1 | * | 1/2001 | Chi | 438/253 |
| 6,352,896 B1 | * | 3/2002 | Liu et al. | 438/253 |
| 6,479,355 B2 | * | 11/2002 | Wu et al. | 438/279 |
| 2001/0054719 A1 | * | 12/2001 | Ahn et al. | 257/202 |
| 2002/0070398 A1 | * | 6/2002 | Lee | 257/296 |
| 2003/0013253 A1 | * | 1/2003 | Hurley | 438/257 |

FOREIGN PATENT DOCUMENTS

KR 0028824 5/2000

OTHER PUBLICATIONS

English Abstract.

* cited by examiner

Primary Examiner—Hsien Ming Lee
(74) Attorney, Agent, or Firm—F. Chau & Associates, LLC

(57) ABSTRACT

A semiconductor device having self-aligned contact pads and a method for manufacturing the same are provided. The semiconductor device includes a semiconductor substrate and an isolation layer formed on the semiconductor substrate. The semiconductor substrate defines a plurality of active regions that each have a major axis and a minor axis. A plurality of gates are formed to cross the plurality of active regions and extend in the direction of the minor axis. First and second source/drain regions are formed in active regions at either side of each of the gates. First and second self-aligned contact pads (SACs) are formed to contact the top surfaces of the first and second source/drain regions, respectively.

22 Claims, 19 Drawing Sheets

SEMICONDUCTOR DEVICE HAVING SELF-ALIGNED CONTACT PADS AND METHOD FOR MANUFACTURING THE SAME

BACKGROUND OF THE INVENTION

1. Field of the Invention

The present invention relates to a semiconductor device and a method for manufacturing the same, and more particularly, to a semiconductor device having self-aligned contact pads (SACs) and a method for manufacturing the same.

2. Description of the Related Art

As the integration density of semiconductor devices increases, gaps between adjacent devices disposed within the semiconductor devices decrease, and an area occupied by each of the semiconductor devices decreases. Accordingly, the area of a contact region continues to decrease, and contact margins also become reduced. Thus, alignment margins required in a photolithographic process become reduced. Recently, a method for manufacturing self-aligned contact pads in a highly integrated semiconductor device, which is capable of increasing alignment margins, has been suggested.

A conventional semiconductor device having self-aligned contact pads (SACs) and a method for manufacturing the same will be described with reference to FIGS. 1, 2, 3A, 3B, 4A, and 4B. FIGS. 1 and 2 are plan views illustrating a portion of a semiconductor device having SACS, where the semiconductor device is made using a conventional manufacturing method. FIGS. 3A and 3B are views illustrating a cross section of a semiconductor substrate taken along lines a–a' and b–b', respectively, of FIG. 1. FIGS. 4A and 4B are views illustrating a cross section of a semiconductor substrate taken along lines a–a' and b–b', respectively, of FIG. 2.

Referring to FIGS. 1, 3A, and 3B, an isolation layer 20 is formed to define active regions 15 on a semiconductor substrate 10. The active regions 15 each have a major axis and a minor axis. A plurality of gates 35 are formed on the semiconductor substrate 10 to cross the active regions 15 and extend in the direction of the minor axis of each of the active regions 15. Each of the gates 35 includes a stacked structure comprised of a gate insulating layer 22, a gate electrode 25, and a capping layer 27, and spacers 30 formed to surround the sidewalls of each of the stacked structures. Two gates 35 are disposed on each of the active regions 15. Here, the capping layer 27 and the spacers 30 are formed of a nitride layer which has a different etching selectivity from that of an interlayer insulating layer to be formed in a subsequent process.

Next, impurities are implanted into the active regions 15 at either side of each of the gates 35, thereby forming a first source/drain region 40a and a second source/drain region 40b. An interlayer insulating layer 45 is formed to completely fill a gap between adjacent gates 35, and then the top surface of the interlayer insulating layer 45 is planarized.

Next, photoresist patterns 50 used to form SACs are formed into an island shape on the interlayer insulating layer 45. The photoresist patterns 50 are formed to have the same size as the active regions 15 at rows where the active regions 15 are not formed.

Referring to FIGS. 2, 4A, and 4B, the interlayer insulating layer 45 is etched using the photoresist patterns 50 as etching masks so that first and second contact holes $H_{11}$ and $H_{12}$ are formed to expose the top surfaces of the first and second source/drain regions 40a and 40b, respectively. The photoresist patterns 50 are removed, and then a doped polysilicon layer is formed to completely fill the first and second contact holes $H_{11}$ and $H_{12}$. The top surfaces of the doped polysilicon layer and the interlayer insulating layer 45 are planarized to expose the top surface of the capping layer 27. Thus, first and second SACs 55a and 55b are formed to directly contact the top surfaces of the first and second source/drain regions 40a and 40b, respectively.

During the etching process for forming the first and second contact holes $H_{11}$ and $H_{12}$, an etching gas, such as $C_4F_8$ or $C_5F_8$, is used in order to make the interlayer insulating layer 45 have a high etching selectivity with respect to a nitride layer. However, during the etching process using such an etching gas, a considerable amount of polymer may be generated. If the aspect ratio of a contact hole is high, polymer generated during etching cannot be removed from the contact hole, and thus the etching process may be easily stopped. Accordingly, in order to prevent such a phenomenon, the interlayer insulating layer 45 is over-etched by increasing the etching time.

If the area occupied by the photoresist patterns 50 is small, the uppermost portion of the photoresist patterns 50 may be deformed during over-etching of the interlayer insulating layer 45. In addition, the photoresist patterns 50 may collapse because the photoresist patterns 50 formed into an island shape are weak. In particular, since the edge of each of the photoresist patterns 50 is thinly formed, adjacent first SACs 55a are not completely isolated from each other, and a bridge is generated between the adjacent first SACs 55a.

The amount of etching gas required in etching is proportional to the area of material to be etched, and thus the etch rate of a contact hole having a large width is lower than the etch rate of a contact hole having a small width. If the photoresist patterns 50 are formed in an island shape, the first contact hole $H_{11}$, in which the first SAC 55a will be formed, has a width smaller than the second contact hole $H_{12}$, in which the second SAC 55b will be formed. Thus, the etching rate of the first contact hole $H_{11}$ is different from the etching rate of the second contact hole $H_{12}$. Accordingly, if the amount of etching gas is determined in consideration of the size of only one of the first and second contact holes $H_{11}$ and $H_{12}$, it is difficult to form the other contact hole in a desired shape.

SUMMARY OF THE INVENTION

To solve the above and other related problems of the prior art, there is provided a semiconductor device in which adjacent self-aligned contact pads (SACs) are completely isolated from one another. Moreover, there is provided a method for manufacturing a semiconductor device having SACs, that overcomes the prior art problem of irregular etching of the contact holes in which the SACs are formed due to different contact hole widths.

According to an aspect of the present invention, there is provided a semiconductor device that comprises a semiconductor substrate. An isolation layer is formed on the semiconductor substrate for defining a plurality of active regions. Each of the plurality of active regions has a major axis and a minor axis. A plurality of gates are formed to cross the plurality of active regions and extend in a direction of the minor axis of each of the plurality of active regions. Each of the plurality of gates has a first side and a second side that are opposing and that run along the direction of the minor axis. A plurality of first and second source/drain regions are formed in the plurality of active regions at either of the first side or the second side of each of the plurality of gates. Each of the plurality of first and second source/drain regions has a top surface. A plurality of first self-aligned contact pads (SACs) and a plurality of second SACs are formed to contact the top surface of each of the plurality of first and second source/drain regions, respectively.

According to another aspect of the present invention, each of the plurality of second SACs have sidewalls and a top surface. The isolation layer has a top surface. An arrangement of the plurality of second SACs forms a plurality of columns. An arrangement of the plurality of first SACs forms a plurality of first rows having a plurality of second rows disposed in an alternating arrangement there between. The semiconductor device further comprises a plurality of contact plugs and a plurality of bit lines. Each of the plurality of contact plugs has a top surface. Each of the plurality of contact plugs is formed to contact the sidewalls and a predetermined portion of the top surface of one of the plurality of second SACs and a portion of the top surface of the isolation layer that is positioned along a same one of the plurality of columns as the one of the plurality of the second SACs. Each of the plurality of bit lines is respectively formed along one of the plurality of second rows and extends in a direction of the major axis. The plurality of second rows correspond to areas having an absence of contact between any of the plurality of active regions and the top surface of any of the plurality of contact plugs.

According to yet another aspect of the present invention, the semiconductor device further comprises a plurality of third SACs. Each of the plurality of third SACs have sidewalls and a top surface, and are formed to respectively contact areas of the top surface of the isolation layer that are positioned along a same vertical axis as the plurality of first and second source/drain regions. Each of the plurality of contact plugs is formed to further contact the sidewalls and a predetermined portion of the top surface of one of the plurality of third SACs positioned at the same one of the plurality of columns as the one of the plurality of second SACs, respectively.

According to a further aspect of the present invention, there is provided a method for manufacturing a semiconductor device. An isolation layer is formed on a semiconductor substrate. The isolation layer defines a plurality of active regions. Each of the plurality of active regions has a major axis and a minor axis. A plurality of gates are formed on areas of the semiconductor substrate on which the isolation layer is formed. The plurality of gates are formed to cross the plurality of active regions and extend in a direction of the minor axis of each of the plurality of active regions. Each of the plurality of gates has a top surface, and a first side and a second side that are opposing and that run along the direction of the minor axis. A plurality of first and second drain/source regions are formed in the plurality active regions at either of the first side or the second side of each of the plurality of gates. Each of the plurality of first and second source/drain regions has a top surface. A first interlayer insulating layer is formed on regions of the semiconductor substrate on which the plurality of first and second source/drain regions are formed. The first interlayer insulating layer is formed to completely fill spaces among the plurality of gates and to have a planarized top surface. Photoresist patterns are formed in a line shape at each of a plurality of rows where an absence exists of any formation of the plurality of active regions on the first interlayer insulating layer. The line shape extends in a direction of the major axis. The first interlayer insulating layer is etched using the photoresist patterns as etching masks to form a plurality of contact holes through which the top surface of each of the plurality of first and second source/drain regions are respectively exposed. The photoresist patterns are removed. A plurality of first self-aligned contact pads (SACS) and a plurality of second SACs are formed to respectively contact the top surface of each of the plurality of first and second source/drain regions and to be level with the top surface of each of the plurality of gates, by filling the plurality of contact holes with a conductive material.

According to a yet further aspect of the present invention, the method further comprises the step of forming a material layer that partially fills the spaces among the plurality of gates, subsequent to the step of forming the plurality of first and second source/drain regions. The material layer is formed of an insulating layer having a different etching selectivity from that of the first interlayer insulating layer and is etched along with the first interlayer insulating layer.

According to a yet still further aspect of the present invention, each of the plurality of the second SACs has sidewalls and a top surface, the isolation layer has a top surface, an arrangement of the plurality of second SACs forms a plurality of columns, and an arrangement of the plurality of first SACs forms a plurality of first rows having a plurality of second rows disposed in an alternating arrangement there between. The method further comprises the step of forming a second interlayer insulating layer on portions of the semiconductor substrate on which the plurality of first SACs and the plurality of second SACs are formed. A plurality of contact plugs are formed through the first and the second interlayer insulating layers to respectively contact the sidewalls and a predetermined portion of the top surface of each of the plurality of second SACs and a portion of the top surface of the isolation layer that is positioned along a same one of the plurality of columns as the one of the plurality of second SACs. A plurality of bit lines are formed. Each of the plurality of bit lines are respectively formed along one of the plurality of second rows and extend in a direction of the major axis of each of the plurality of active regions. The plurality of second rows correspond to areas having an absence of contact between any of the plurality of active regions and a top surface of any of the plurality of contact plugs.

According to an additional aspect of the present invention, the method further comprises the step of forming a plurality of third SACS to respectively contact the top surface of the isolation layer positioned along a same horizontal axis as the plurality of first and second source/ drain regions. Each of the plurality of contact plugs is formed to further contact sidewalls and a predetermined portion of each of the plurality of third SACs positioned at the same column as the one of the plurality of second SACs.

According to a yet additional aspect of the present invention, each of the photoresist patterns are formed to include a protrusion covering the top surface of the isolation layer positioned each of a plurality of rows whereat the plurality of active regions are formed.

According to the present invention, it is possible to manufacture a semiconductor device in which adjacent self-aligned contact pads are completely isolated from one another. In addition, it is possible to solve the problem of the prior art in which contact holes, wherein self-aligned contact pads will be formed, are irregularly etched due to their different widths.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Figure 1:
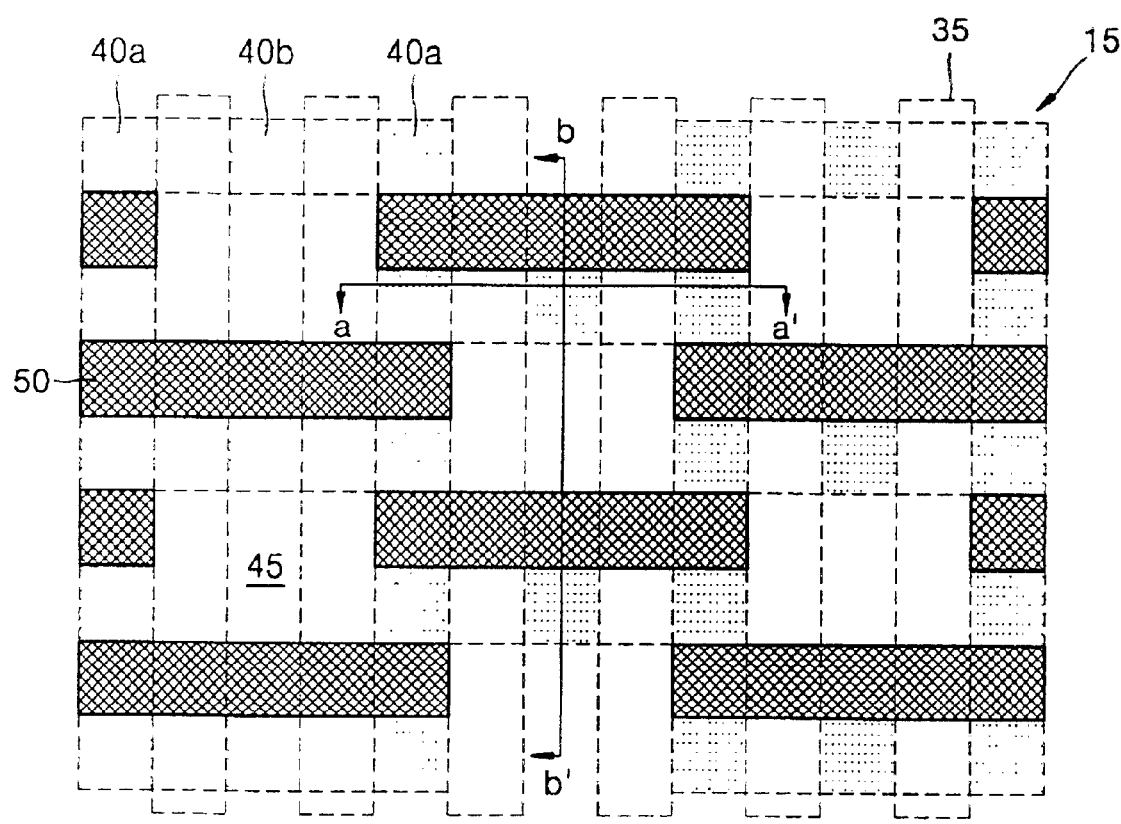
FIGS. 1, 2, 3A, 3B, 4A, and 4B are diagrams illustrating a conventional semiconductor device having self-aligned contact pads (SACs) and a method for manufacturing the same.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

A first illustrative embodiment of the present invention will now be described.

Figure 5:
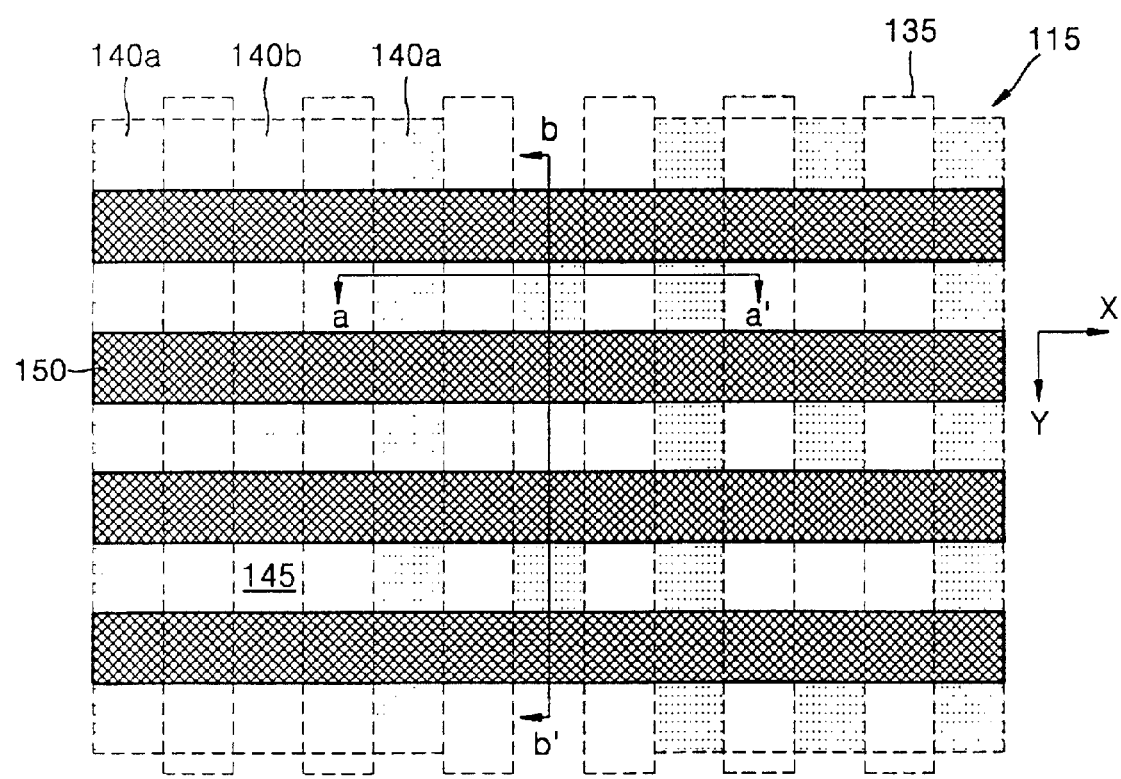
FIGS. 5, 6, 7A, 7B, 8A, and 8B are diagrams illustrating a semiconductor device according to a first embodiment of the present invention and a method for manufacturing the same.
Figure 6:
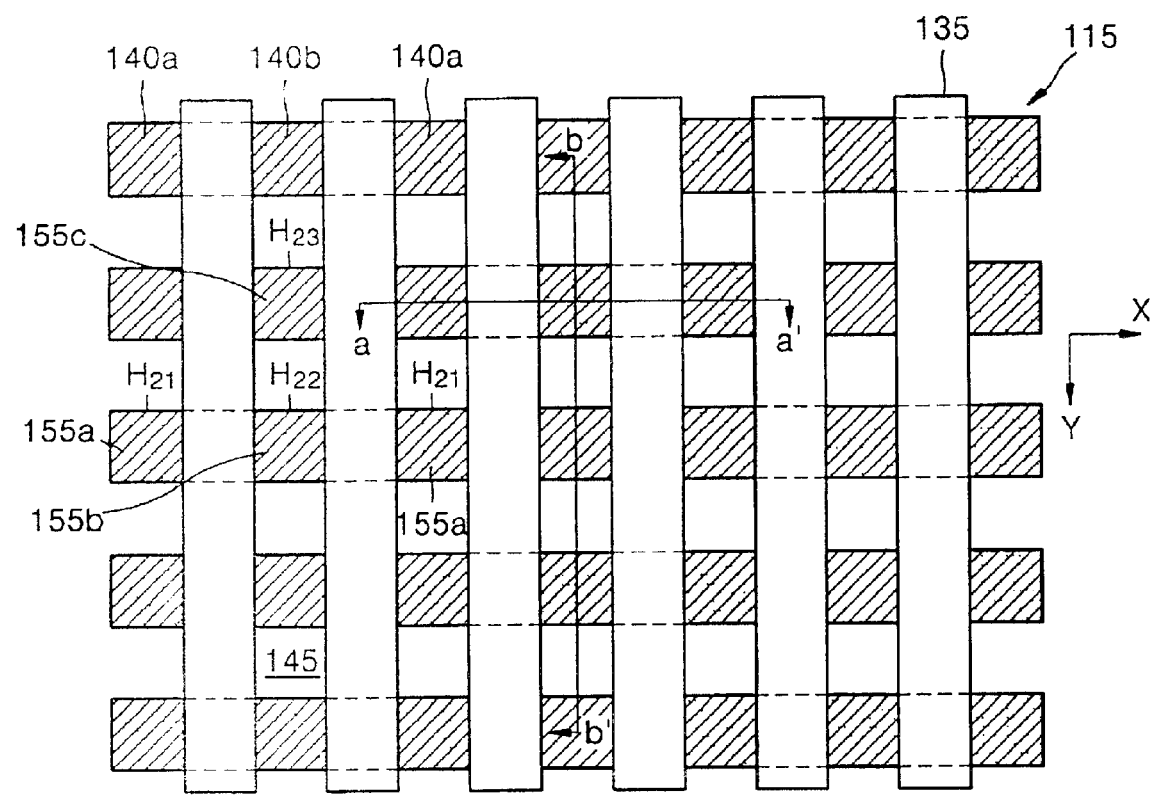
Figure 7A:
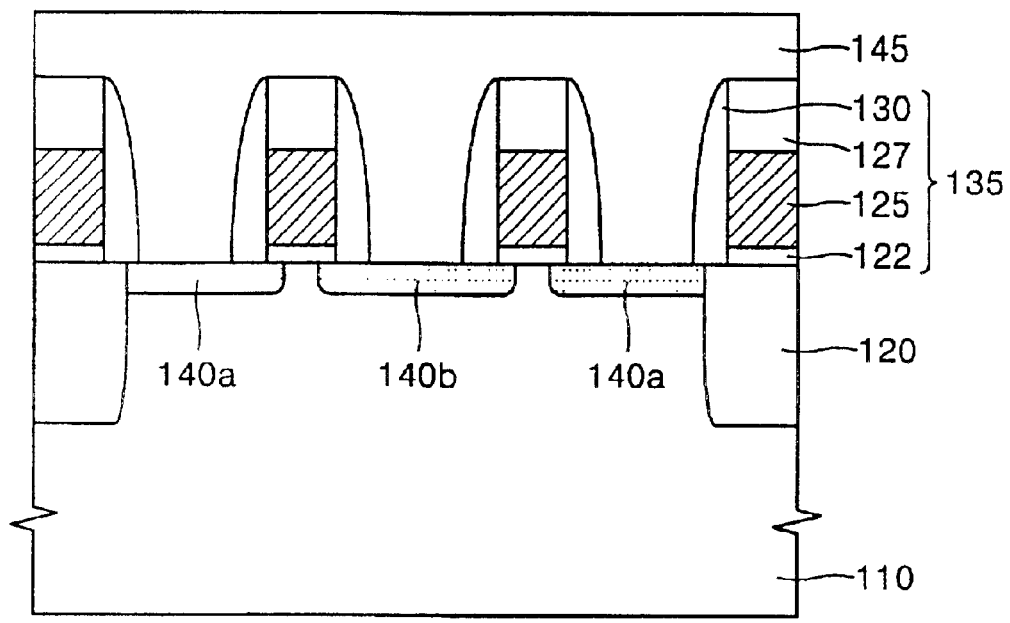
Figure 7B:
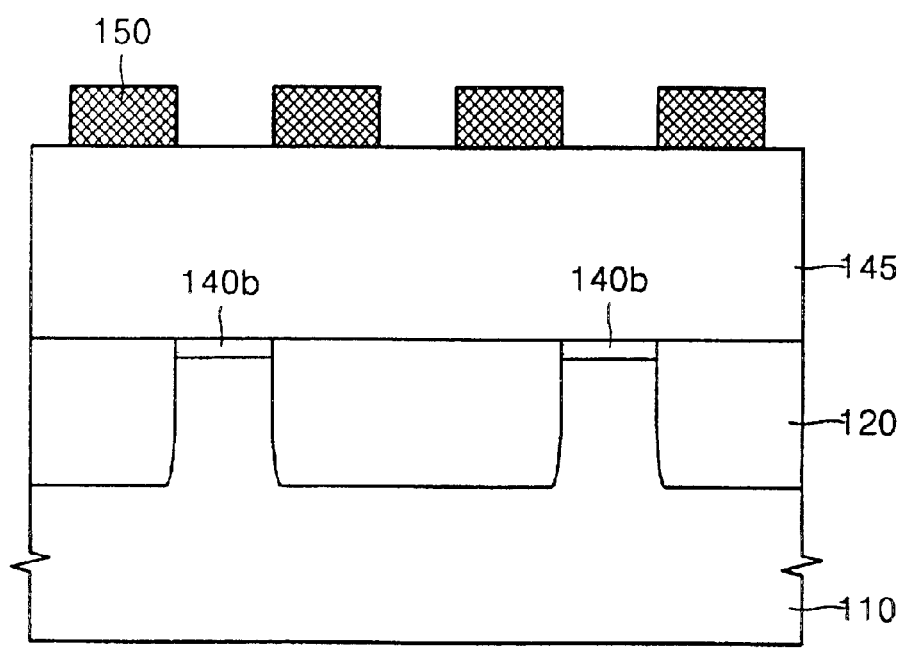
Figure 8A:
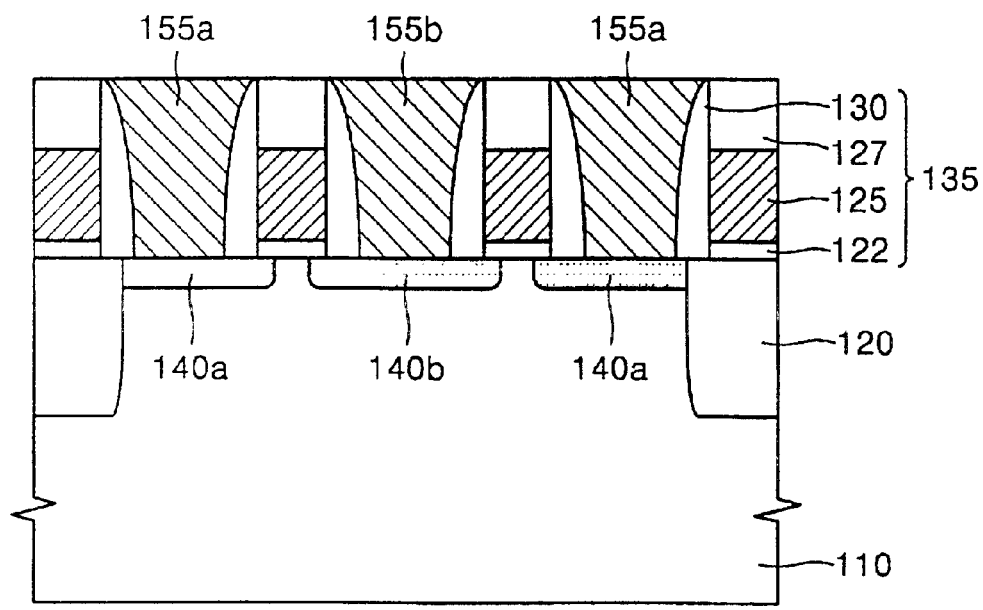
Figure 8B:
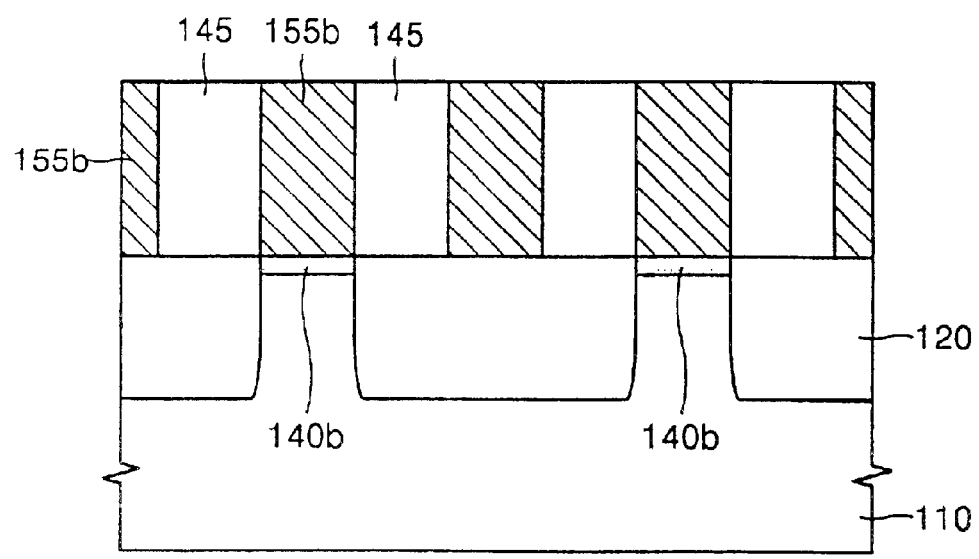

FIGS. 5, 6, 7A, 7B, 8A, and 8B are diagrams illustrating a semiconductor device according to a first embodiment of the present invention and a method for manufacturing the same. Specifically, FIGS. 5 and 6 are plan views illustrating a semiconductor device according to a first embodiment of the present invention and a method for manufacturing the same. FIGS. 7A and 7B are views illustrating a cross section of a semiconductor substrate taken along lines a–a' and b–b', respectively, of FIG. 5. FIGS. 8A and 8B are views illustrating a cross section of a semiconductor substrate taken along lines a–a' and b–b', respectively, of FIG. 6.

Referring to FIGS. 5, 7A and 7B, an isolation layer 120 is formed to define a plurality of active regions 115 on a semiconductor substrate 110. The active regions 115 are arranged in a zigzag-like manner (e.g., horizontal and vertical patterns) and each have a major axis and a minor axis. Next, a plurality of gates 135 are formed to cross the active regions 115 and extend in the direction Y of the minor axis of each of the active regions 115. The gates 135 are formed such that two gates cross one active region 115.

Each of the gates 135 is formed to include a stacked body comprised of a gate insulating layer 122, a gate electrode 125 and a capping layer 127 and gate spacers surrounding the sidewalls of the stacked body. The gate electrode 125 is formed out of a doped polysilicon layer. If necessary, a double layer consisting of a doped polysilicon layer and a tungsten silicide layer may be formed into a polycide structure as the gate electrode 125. Here, the capping layer 127 and the gate spacers 130 are formed of an insulating layer which has a different etching selectivity from that of an interlayer insulating layer to be formed in a subsequent process. For example, the capping layer 127 and the gate spacers 130 may be formed of a nitride layer or a nitride oxide layer.

Next, impurities are implanted into the active regions 115 at either side of each of the gates 135, thereby forming a first source/drain region and a second source/drain region 140a and 140b. A material layer (not illustrated as an independent layer) is formed so as not to completely fill spaces among the gates 135. Next, a first interlayer insulating layer 145 is formed to completely fill the spaces among the gates 135. The top surface of the interlayer insulating layer 145 is planarized by etch-back or chemical mechanical polishing (CMP). In FIGS. 7A and 7B, the first interlayer insulating layer 145 is illustrated as being higher than the gates 135; however, the first interlayer insulating layer 145 may be formed to be level with the gates 135. The material layer is formed of an insulating layer which has a different etching selectivity from that of the first interlayer insulating layer 145. For example, the material layer is formed of a nitride layer or a nitride oxide layer. The reason that the material layer is formed of, for example, a nitride layer or a nitride oxide layer, is to make the material layer act as an etching stopper during etching the first interlayer insulating layer 145.

Next, a photoresist layer (not shown) is deposited on the interlayer insulating layer 145. The photoresist layer is exposed to light and developed such that the photoresist layer remains in a line shape only at rows where the active regions 115 are not formed. In order to reduce light-reflection during the exposure of the photoresist layer, an anti-reflection layer may be interposed between the first interlayer insulating layer 145 and the photoresist layer. Finally, photoresist patterns 150 are formed. The photoresist patterns 150 are formed to extend in the direction X of the major axis of each of the active regions 115 and remain only at the rows where the active regions 115 are not formed, as a line shape.

Accordingly, it is possible to provide additional, sufficient room for the photoresist layer used to form the photoresist patterns 150 in a line shape and increase the thickness of the photoresist layer considerably more than conventional island-shaped photoresist patterns. In addition, in the present embodiment, the photoresist patterns 150 can be prevented from collapsing and the edge of each of the photoresist patterns 150 can be prevented from being deformed.

Referring to FIGS. 6, 8A, and 8B, the first interlayer insulating layer 145 is etched using the photoresist patterns 150 as etching masks. Since the material layer is formed of an insulating layer having a different etching selectivity from that of the first interlayer insulating layer 145, the material layer can act as an etching stopper during etching of the first interlayer insulating layer 145. Contact holes $H_{21}$, $H_{22}$, and $H_{23}$ exposing first and second source/drain regions 140a and 140b and the top surface of the isolation layer 120 positioned at the same row as the first and second source/drain regions 140a and 140b are formed. Since the photoresist patterns 150 are formed in a line shape, the contact holes $H_{21}$, $H_{22}$, and $H_{23}$ are formed to have the same size. Thus, the problem of contact holes that are irregularly etched due to their different widths in the prior art can be solved.

Next, the photoresist patterns 150 are removed, and then a conductive layer is formed to completely fill the contact holes $H_{21}$, $H_{22}$, and $H_{23}$. A doped polysilicon layer may be formed as the conductive layer. Next, the top surfaces of the conductive layer and the first interlayer insulating layer 145 are planarized by etch-back or CMP, thereby forming first, second, and third SACs 155a, 155b, and 155c. The first through third SACs 155a, 155b, and 155c are formed to be level with the gates 135, to contact the first and second source/drain regions 140a and 140b, and the top surface of the isolation layer 120 positioned at the same row as the first and second source/drain regions 140a and 140b, and to have the same size. Since the photoresist patterns 150 are formed in a line shape, the edge of each of the photoresist patterns 150 can be prevented from being deformed, and thus adjacent SACs can be completely isolated from one another.

A second illustrative embodiment of the present invention will now be described.

Figure 9:
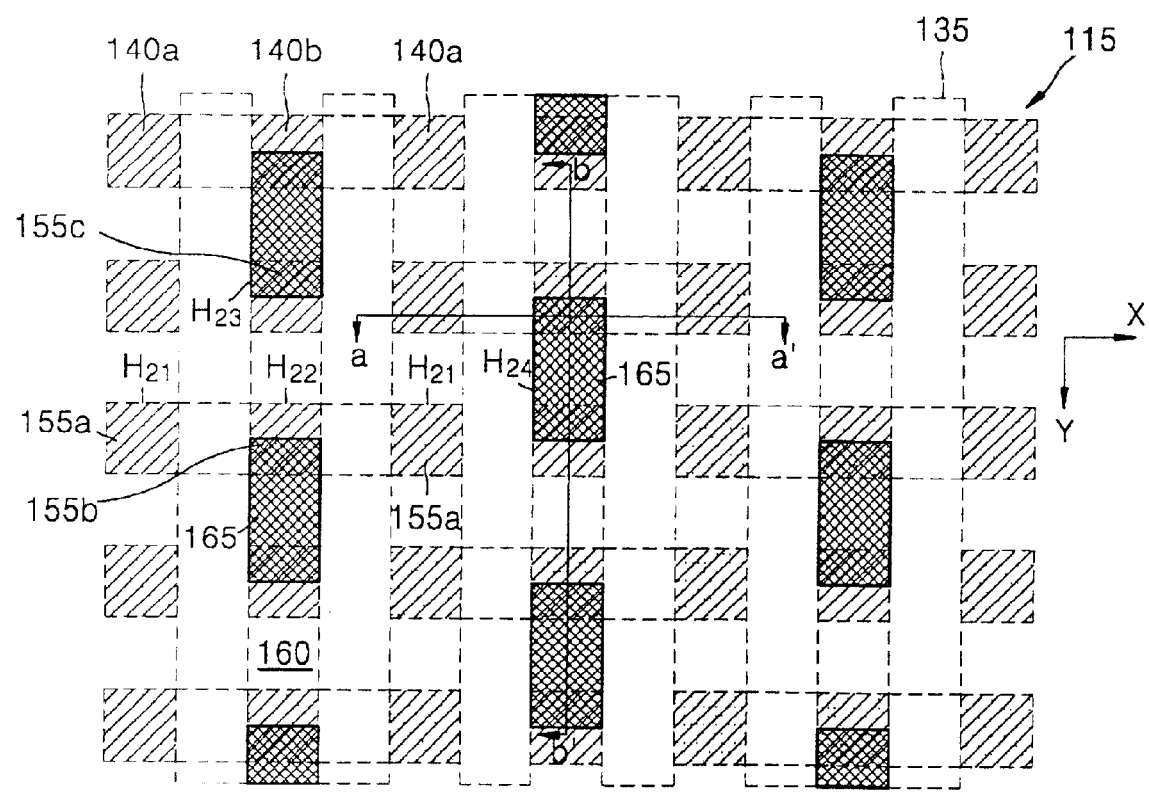
FIGS. 9, 10, 11A, 11B, 12A, and 12B are diagrams illustrating a semiconductor device according to a second embodiment of the present invention and a method for manufacturing the same.
Figure 10:
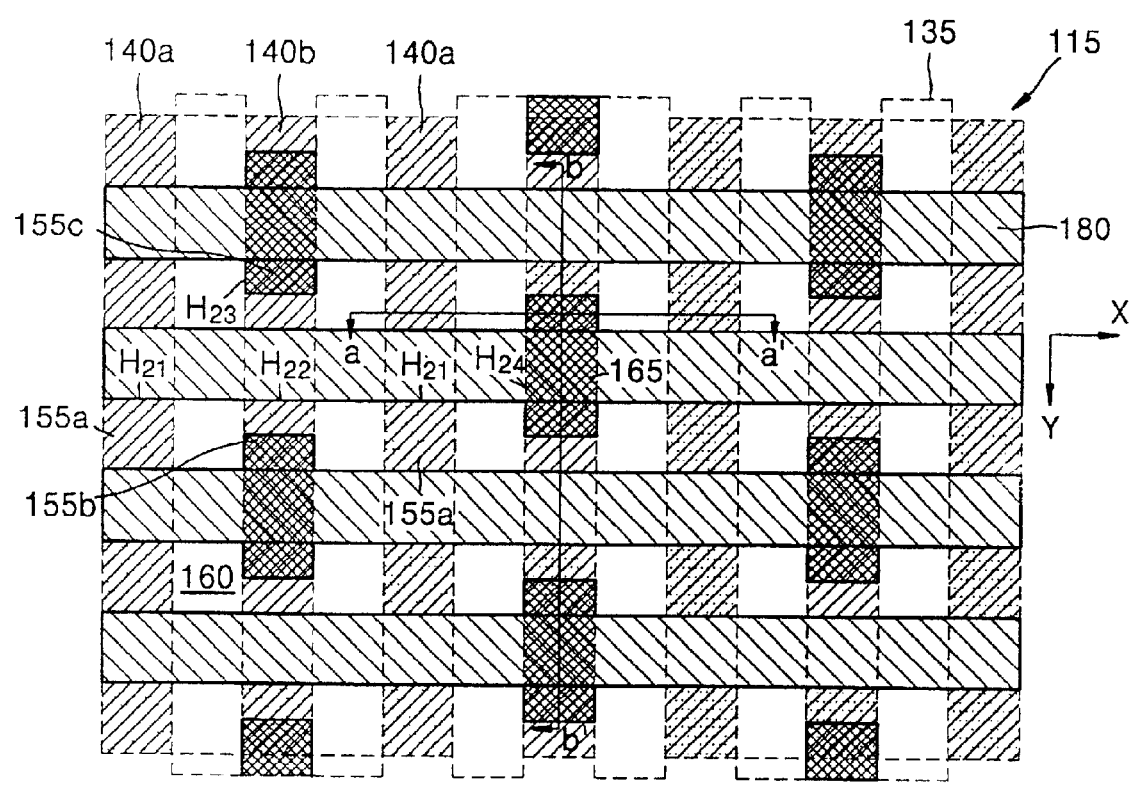
Figure 11A:
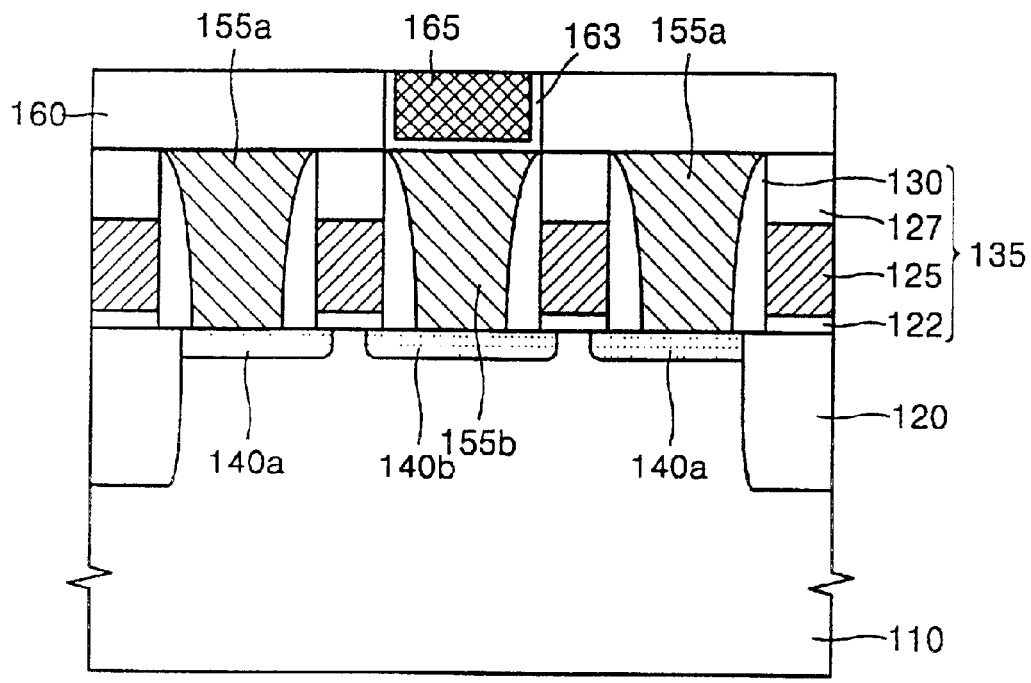
Figure 11B:
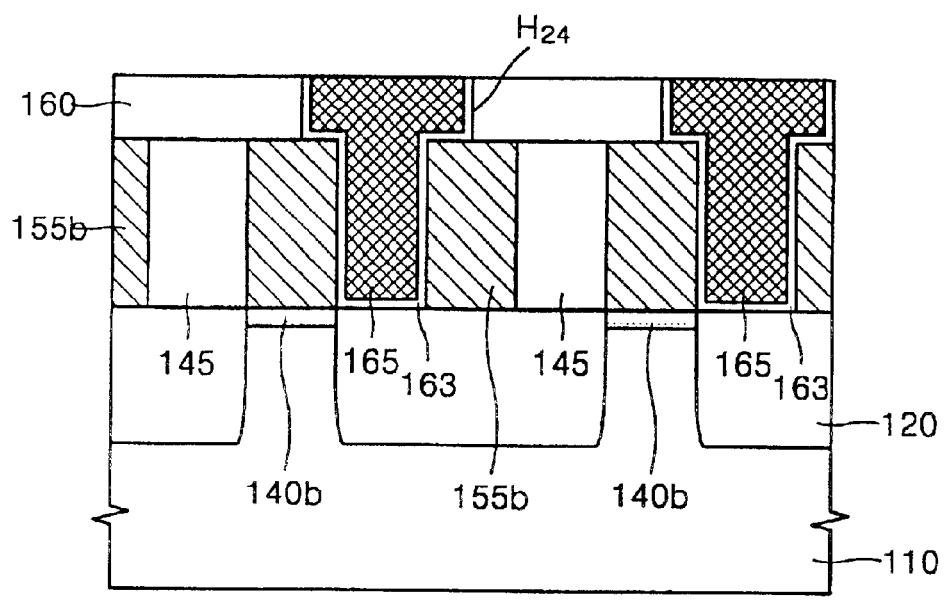
Figure 12A:
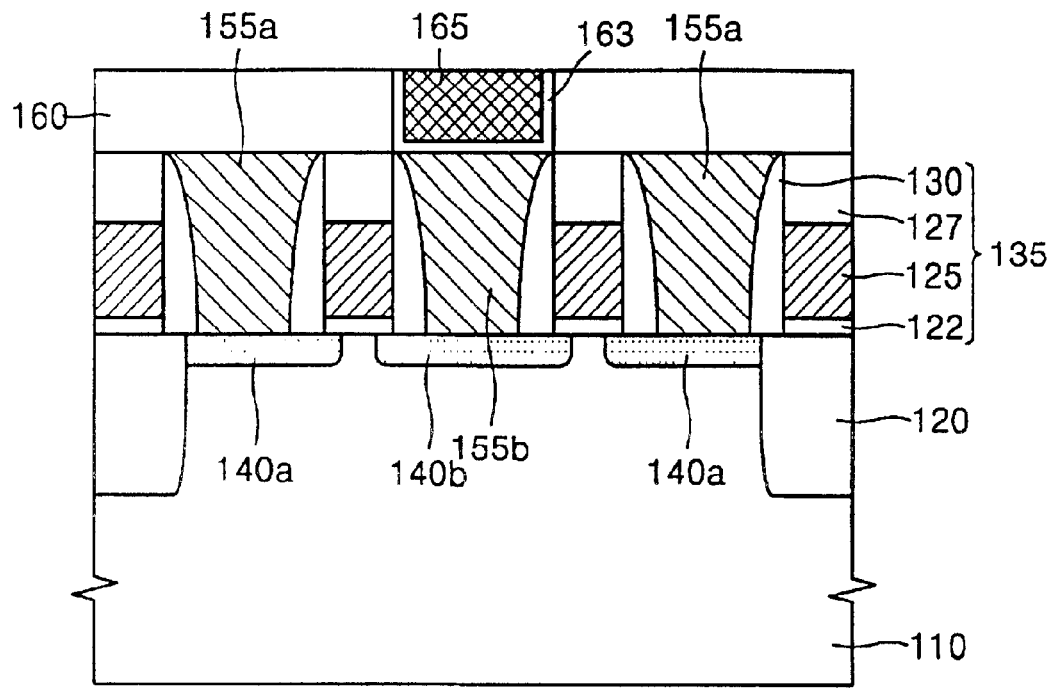
Figure 12B:
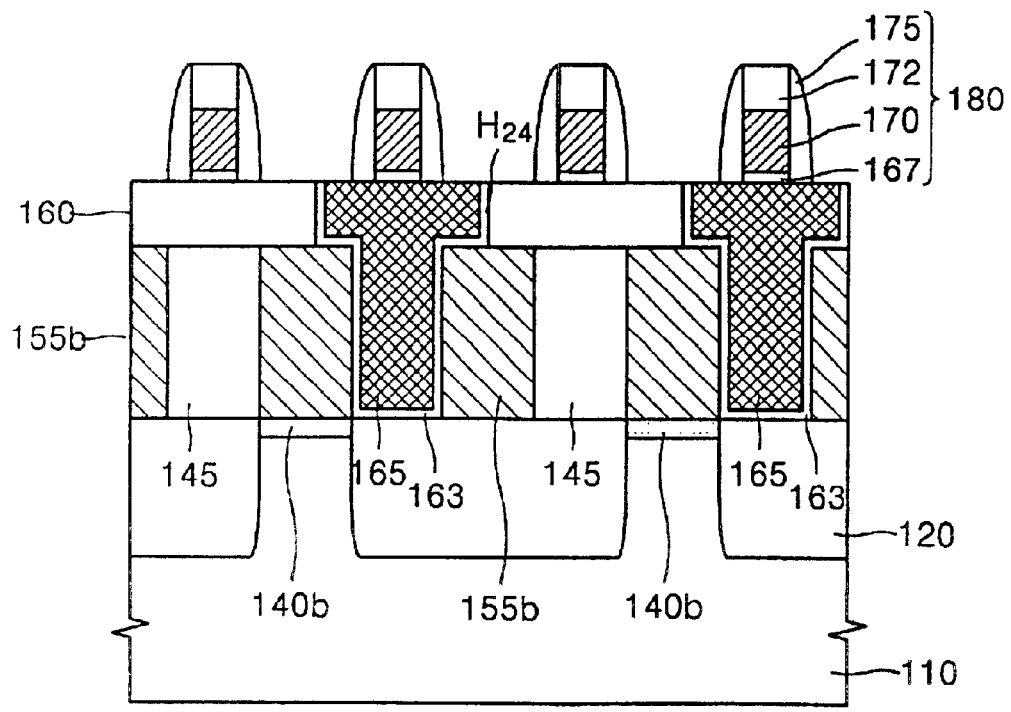

FIGS. 9, 10, 11A, 11B, 12A, and 12B are diagrams illustrating a semiconductor device according to a second embodiment of the present invention and a method for manufacturing the same. Specifically, FIGS. 9 and 10 are plan views illustrating a semiconductor device according to a second embodiment of the present invention and a method for manufacturing the same. FIGS. 11A and 11B are views illustrating a cross section of a semiconductor substrate taken along lines a–a' and b–b', respectively, of FIG. 9. FIGS. 12A and 12B are views illustrating a cross section of a semiconductor substrate taken along lines a–a' and b–b', respectively, of FIG. 10. The same reference numerals in the first and second embodiments represent the same elements. In the second embodiment, processes subsequent to the processes described in the first embodiment will be described.

Referring to FIGS. 9, 11A, and 11B, a second interlayer insulating layer 160 is formed on the semiconductor substrate 110 shown in FIG. 6 after the processes described in the first embodiment are performed. The first interlayer insulating layer 145 and the second interlayer insulating layer 160 are etched to form a contact hole $H_{24}$, through which the sidewalls and a predetermined portion of the top surface of the second SAC 155b and the top surface of the isolation layer 120 positioned at a row next to the row where the second SAC 155b is positioned, and at the same column as the second SAC 155b are exposed. As shown in FIGS. 11A and 11B, the contact hole $H_{24}$ may be formed to expose the sidewalls and a predetermined portion of the top surface of the third SAC 155c positioned at the same column as the second SAC 155b.

A barrier metal layer 163 is formed at the sidewalls and bottom of the contact hole $H_{24}$. In a case where a conductive layer is formed of a metal layer to completely fill the contact hole $H_{24}$, the barrier metal layer 163 prevents metal atoms in the metal layer from diffusing into the interlayer insulating layers 145 and 160. The barrier metal layer 163 may be formed of a double layer consisting of a titanium (Ti) layer and a TiN layer. The double layer consisting of a Ti layer and a TiN layer may be formed by chemical vapor deposition (CVD).

Figure 2:
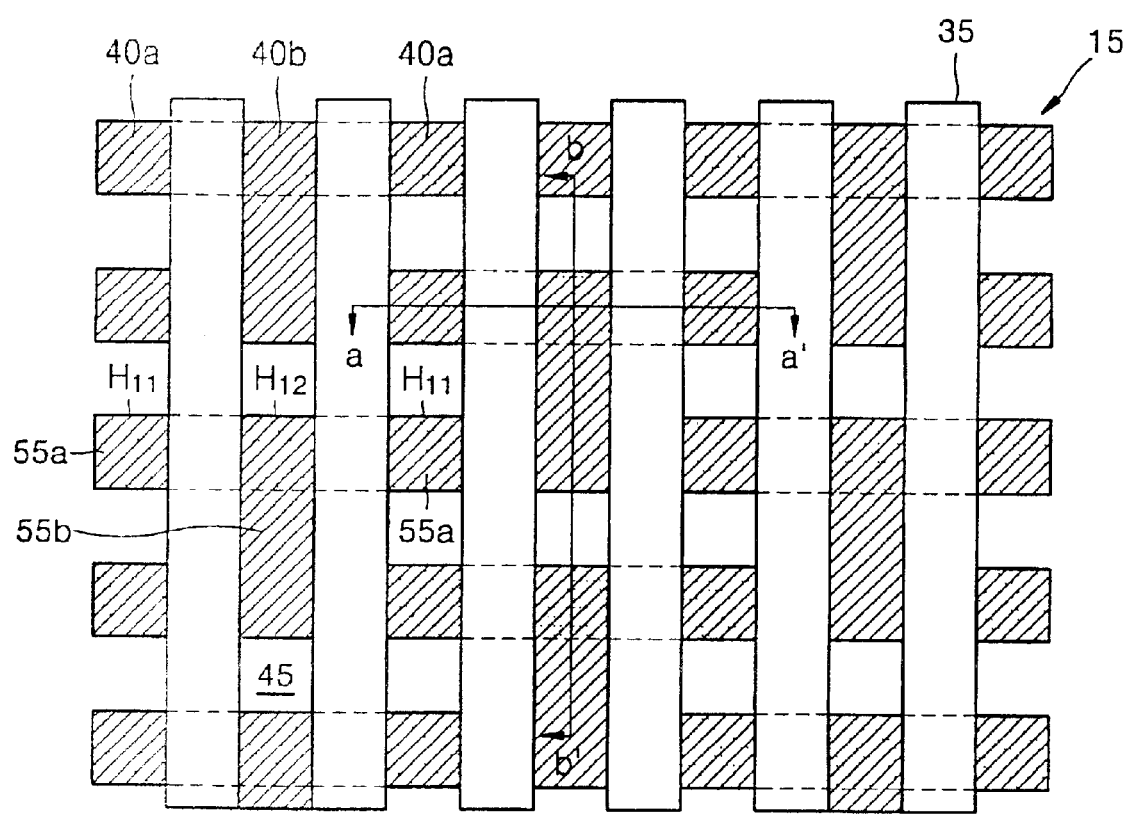
Figure 3A:
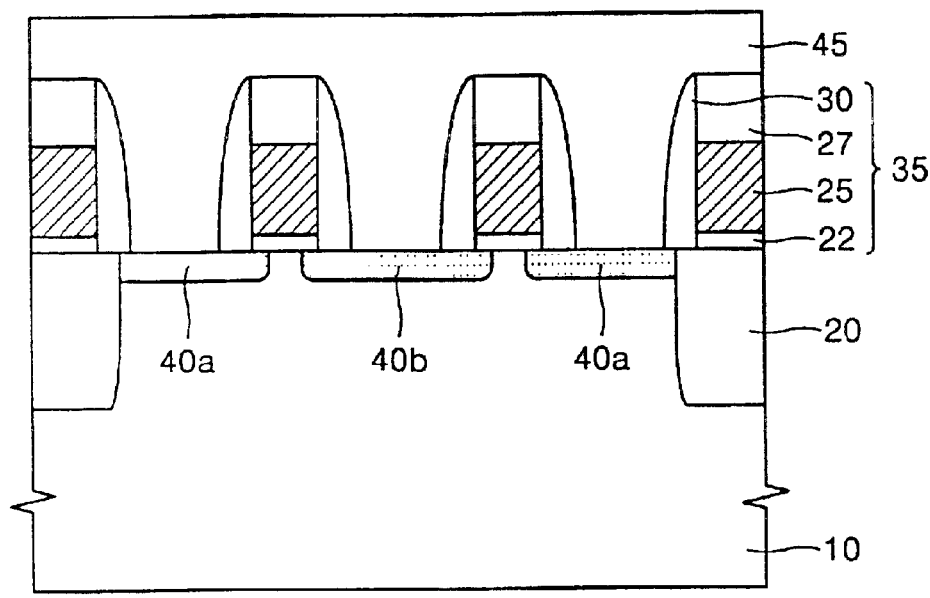
Figure 3B:
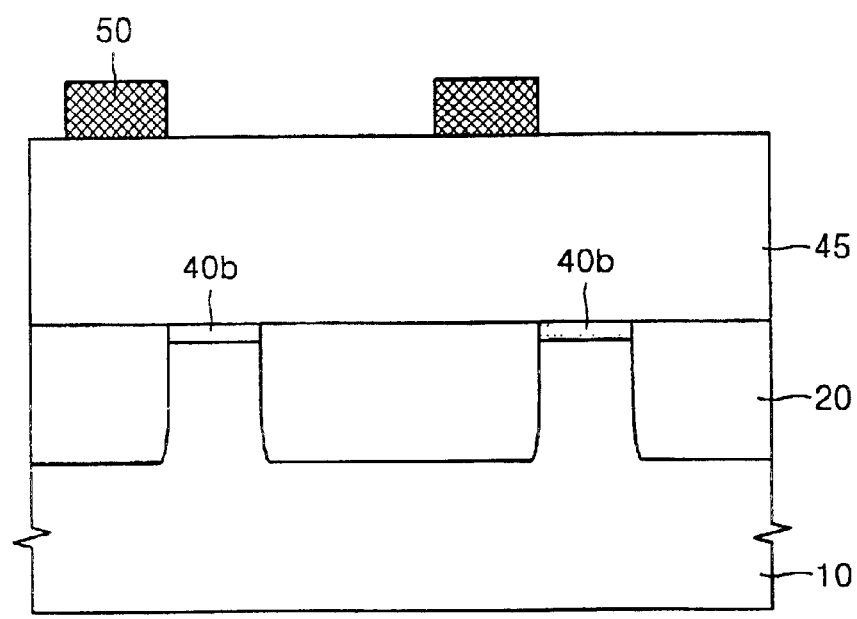
Figure 4A:
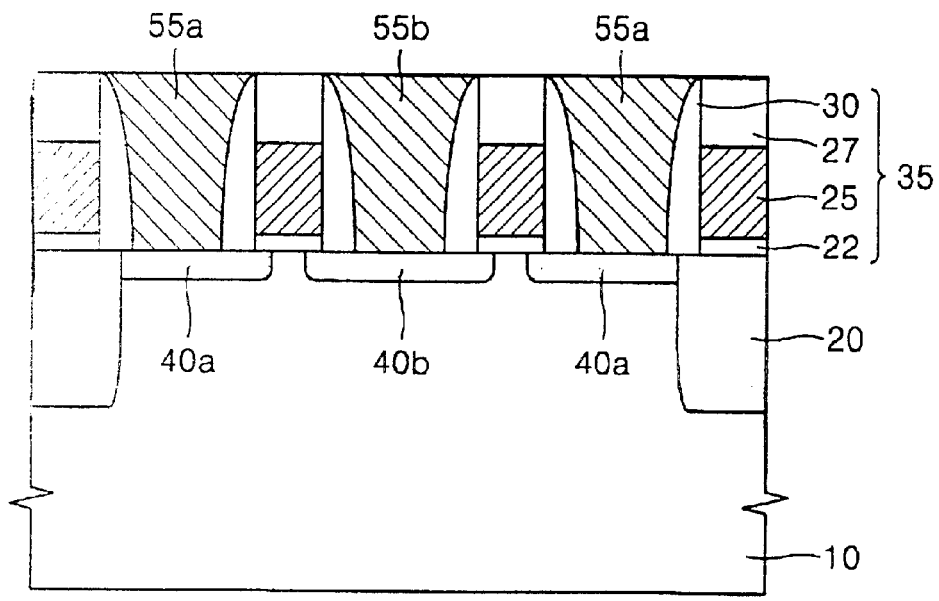
Figure 4B:
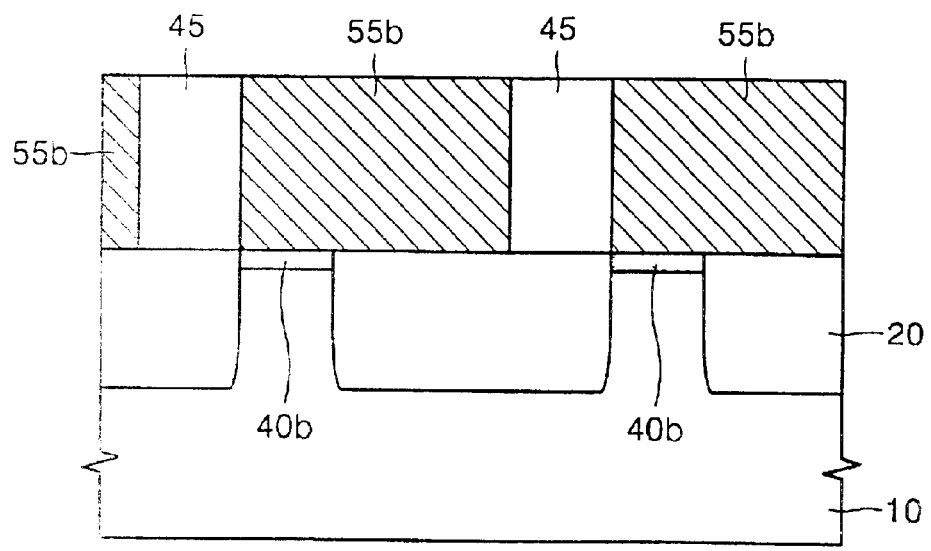

Next, the conductive layer is formed to completely fill the contact hole $H_{24}$. The conductive layer may be formed of a tungsten (W) layer. The top surface of the conductive layer is planarized by etch-back or CMP until the top surface of the interlayer insulating layer 160 is exposed. As a result of planarization, a contact plug 165 is formed through the interlayer insulating layers 145 and 160 to contact the sidewalls and a predetermined portion of the top surface of the second SAC 155b, the top surface of the isolation layer 120 positioned at the same column as the second SAC 155b, and the sidewalls and a predetermined portion of the top surface of the third SAC 155c positioned at the same column as the second SAC 155b. In the prior art, since the second SAC 55b is formed to have a larger size than the first SAC 55a, a contact plug is formed to contact the top surface of the second SAC 55b, as shown in FIGS. 2, 4A, and 4B. However, in the present invention, the contact plug 165 is formed to contact the sidewalls of the second SAC 155b as well as the top surface of the isolation layer 120, and thus the contact plug 165 can be electrically connected to the active regions 115. The contact plugs 165 may be formed greater than conventional contact plugs.

Referring to FIGS. 10, 12A, and 12B, a bit line 180 is formed to contact the top surface of the contact plug 165 and extend in the direction X of the major axis of each of the active regions at every row the active regions 115 are not formed. The bit line 180 is formed to have a width smaller than the width of the contact plug 165. Specifically, in order to form the bit line 180, a conductive recess-prevention layer 167, a bit line conductive layer 170, and a bit line capping layer 172 are sequentially formed on the semiconductor substrate 110 on which the contact plug 165 is formed. The bit line conductive layer 170 may be formed of a W layer. Next, photoresist patterns (not shown) used to form the bit line 180 are formed at every row where the active regions 115 are formed on the bit line capping layer 172. The bit line capping layer 172 and the bit line conductive layer 170 are patterned using the photoresist patterns as etching masks. Next, the conductive recess-prevention layer 167 is patterned. The conductive recess-prevention layer 167 prevents the surface of each of the contact plugs 165 from being recessed during patterning of the bit line capping layer 172 and the bit line conductive layer 170. The photoresist patterns are removed, and then bit line spacers 175 are formed to surround the sidewalls of the patterned conductive recess-prevention layer 167, bit line conductive layer 170, and bit line capping layer 172. The conductive recess-prevention layer 167 must be formed of a conductive layer and may be formed of a double layer consisting of a Ti layer and a TiN layer. The double layer consisting of a Ti layer and a TiN layer may be formed by CVD. If the conductive recess-prevention layer 167 is formed of a double layer consisting of a Ti layer and a TiN layer, the conductive recess-prevention layer 167 can act as a barrier metal layer.

A third illustrative embodiment of the present invention will now be described.

Figure 13:
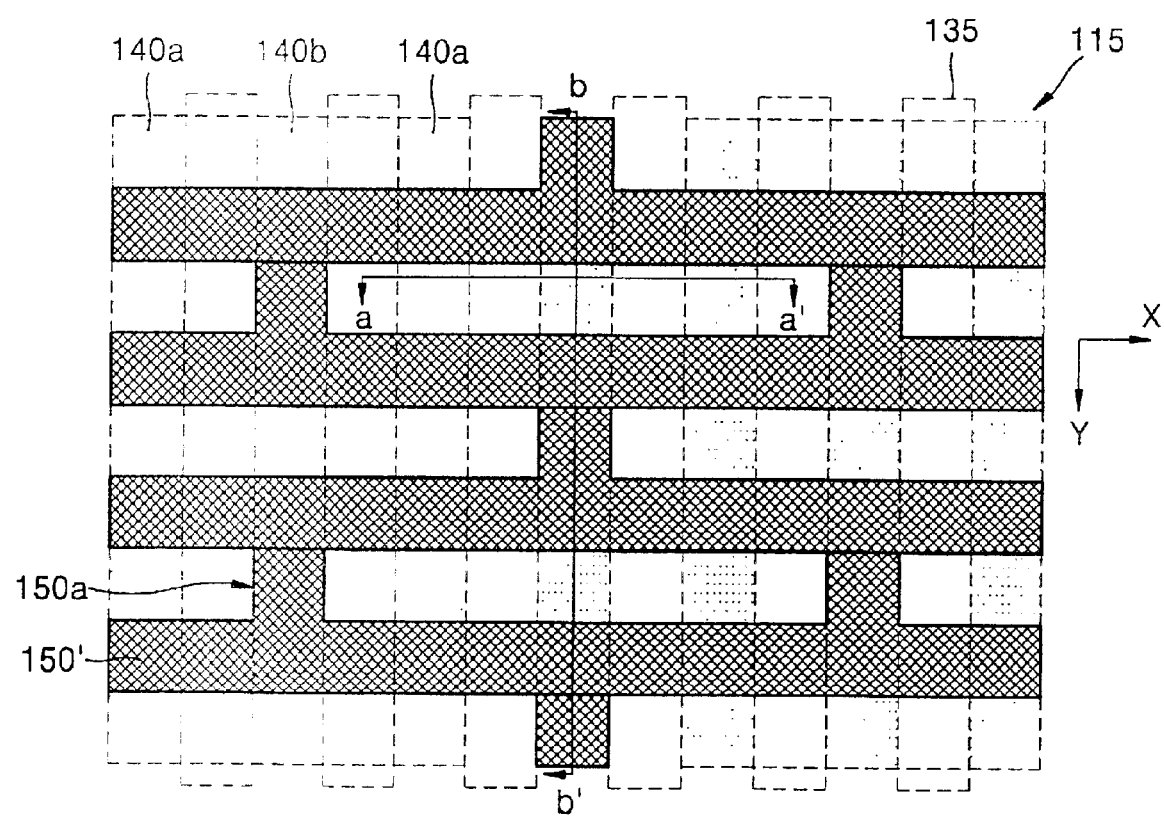
FIGS. 13, 14, 15A, 15B, 16A, and 16B are diagrams illustrating a semiconductor device according to a third embodiment of the present invention and a method for manufacturing the same.
Figure 14:
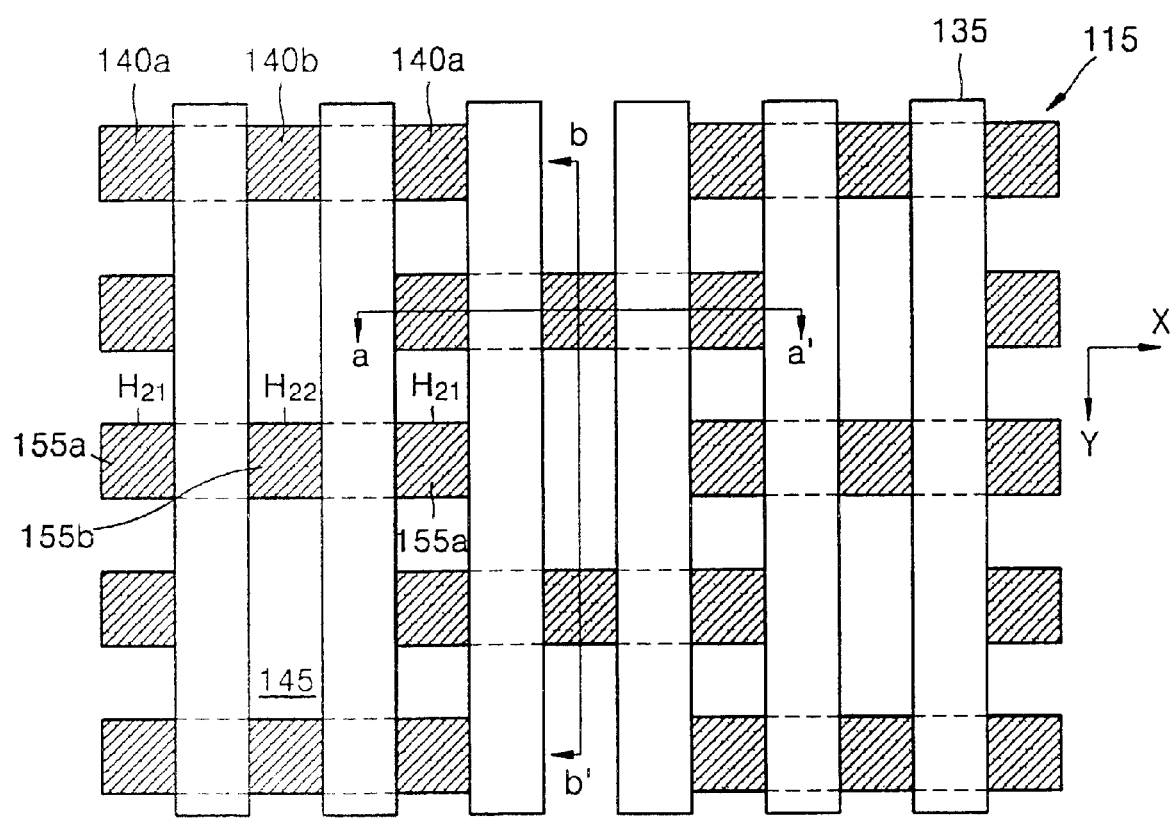
Figure 15A:
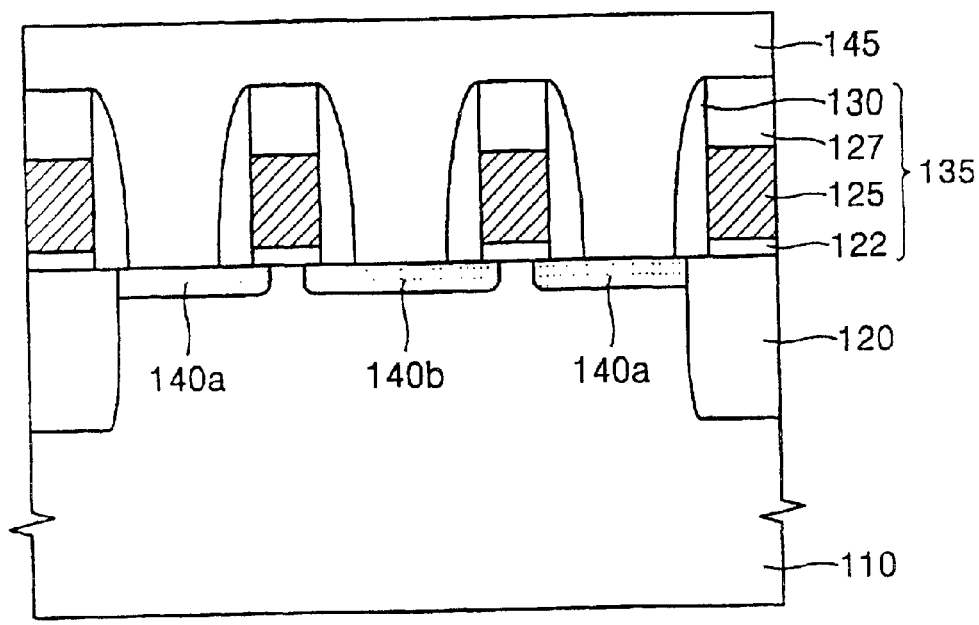
Figure 15B:
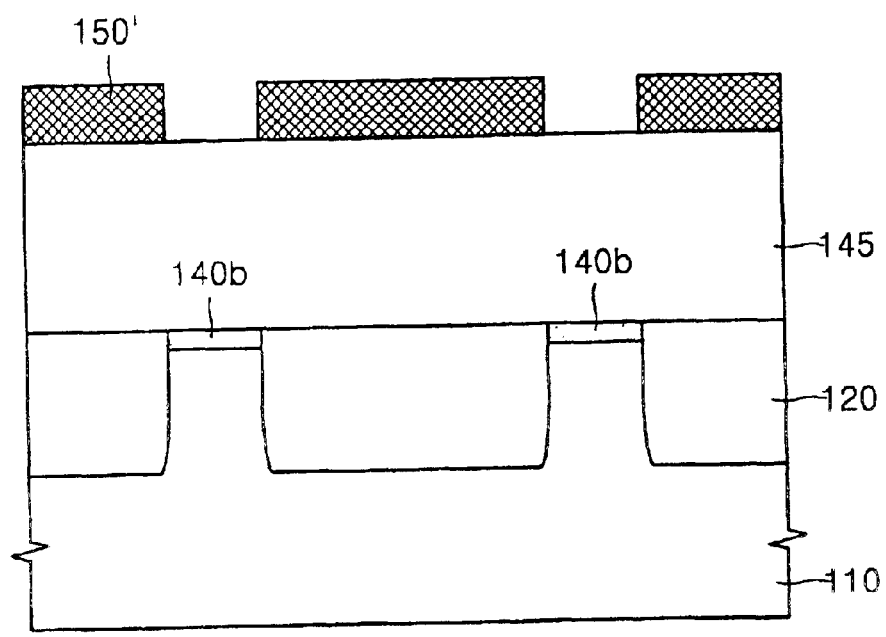
Figure 16A:
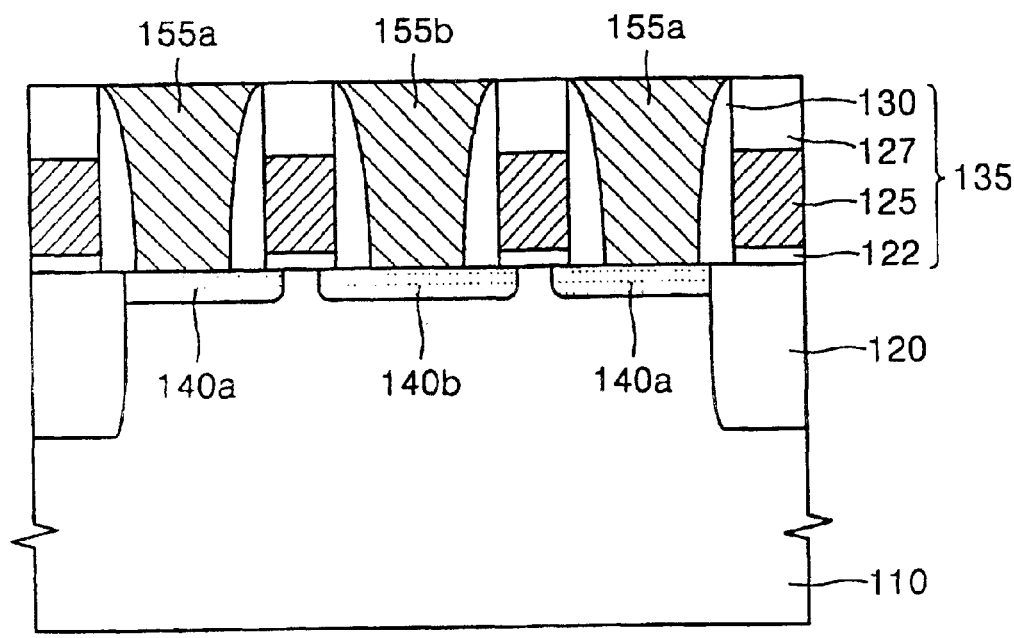
Figure 16B:
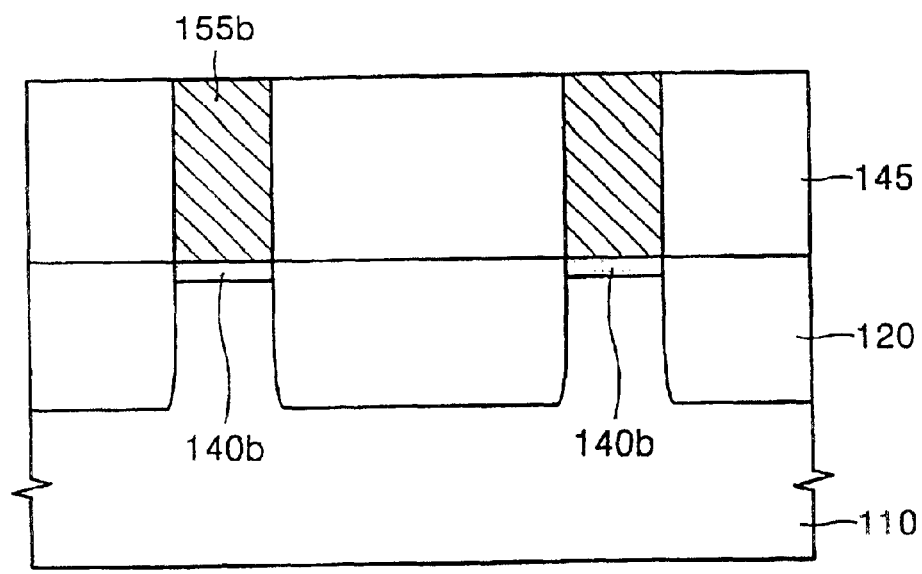

FIGS. 13, 14, 15A, 15B, 16A, and 16B are diagrams illustrating a semiconductor device according to a third embodiment of the present invention and a method for manufacturing the same. Specifically, FIGS. 13 and 14 are plan views illustrating a method for manufacturing a semiconductor device according to a third embodiment of the present invention. FIGS. 15A and 15B are views illustrating a cross section of a semiconductor substrate taken along lines a–a' and b–b', respectively, of FIG. 13. FIGS. 16A and 16B are cross-sectional views illustrating a semiconductor substrate taken along lines a–a' and b–b', respectively, of FIG. 14. The same reference numerals in the first and third embodiments represent the same elements. In addition, in the third embodiment, processes prior to the formation of photoresist patterns used to form SACs are the same as those of the first embodiment.

Referring to FIGS. 13, 15A, and 15B, the interlayer insulating layer 145 and underlying layers are formed like in the first embodiment. Next, photoresist patterns 150' are formed in a line shape at every row where the active regions 115 are not formed on the interlayer insulating layer 145 to extend in the direction X of the major axis of each of the active regions 115. In addition, the photoresist patterns 150' are formed to include protrusions 150a covering the top surface of the isolation layer 120 positioned at the same row as each of the active regions 115. As shown in FIGS. 13, 15A, and 15B, it is possible to provide more sufficient room for a photoresist layer used to form the photoresist patterns 150' into a line shape and increase the thickness of the photoresist layer more considerably than the photoresist patterns 150' formed in an island shape. Accordingly, the photoresist patterns 150' can be prevented from collapsing and the edge of each of the photoresist patterns 150' can be prevented from being deformed.

Referring to FIGS. 14, 16A, and 16B, the interlayer insulating layer 145 is etched using the photoresist patterns 150' as etching masks such that contact holes $H_{21}$ and $H_{22}$ are formed to expose the top surfaces of the first and second source/drain regions 140a and 140b. Since the photoresist patterns 150' are formed in a line shape, the contact holes $H_{21}$ and $H_{22}$ can be formed to have the same size. Thus, the problem of contact holes that are irregularly etched due to their different widths in the prior art can be solved.

Next, the photoresist patterns 150' are removed, and first and second SACs 155a and 155b are formed to be level with the top surface of each of the gates 135 and contact the first and second source/drain regions 140a and 140b, respectively. The first and second SACs 155a and 155b have the same size. Since the edge of each of the photoresist patterns 150' can be prevented from being deformed by forming the photoresist patterns 150' into a line shape, adjacent SACs can be completely isolated from one another.

A fourth illustrative embodiment of the present invention will now be described.

Figure 17:
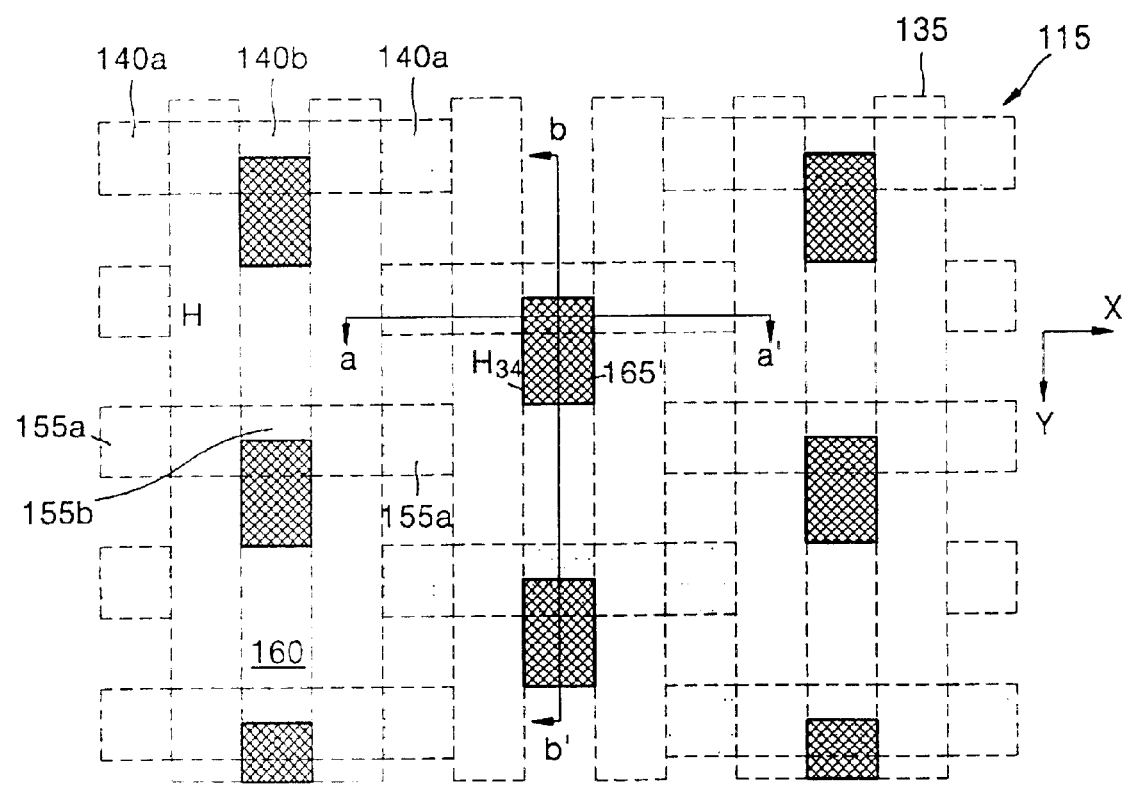
FIGS. 17, 18A, and 18B are diagrams illustrating a semiconductor device according to a fourth embodiment of the present invention and a method for manufacturing the same.
Figure 18A:
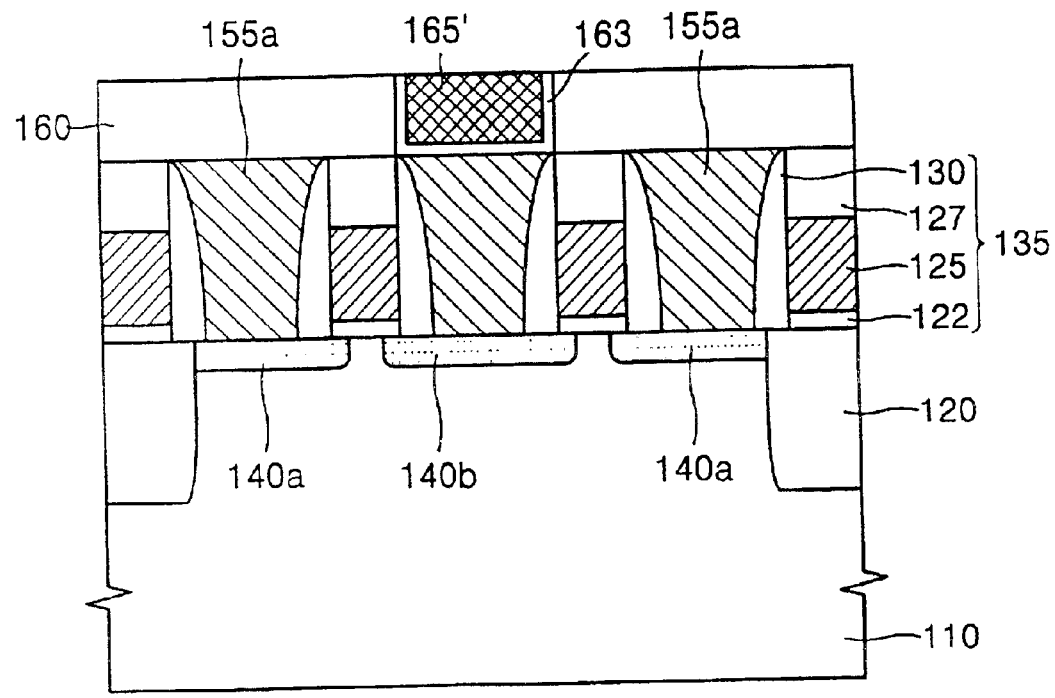
Figure 18B:
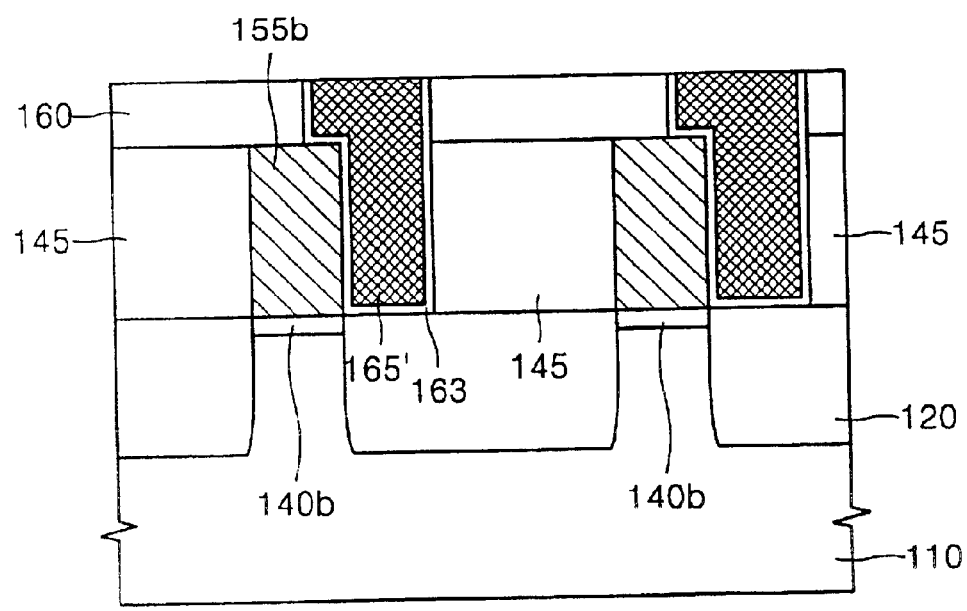

FIGS. 17, 18A, and 18B are diagrams illustrating a semiconductor device according to a fourth embodiment of the present invention and a method for manufacturing the same. Specifically, FIG. 17 is a plan view illustrating a method for manufacturing a semiconductor device according to a fourth embodiment of the present invention. FIGS. 18A and 18B are cross-sectional views illustrating a semiconductor substrate taken along lines a–a' and b–b', respectively, of FIG. 17. The same reference numerals in the third and fourth embodiments represent the same elements. In the fourth embodiment, processes subsequent to the processes described in the third embodiment will be described.

Referring to FIGS. 17, 18A, and 18B, the interlayer insulating layer 160 is formed on the semiconductor substrate 110 shown in FIG. 14. The interlayer insulating layers 145 and 160 are etched to form a contact hole $H_{34}$ through which the sidewalls, a predetermined portion of the top surface of the second SAC 155b, and the top surface of the isolation layer 120 positioned at a row next to the row where the second SAC 155b is positioned and at the same column as the second SAC 155b are exposed. Next, a barrier metal layer 163 is formed at the sidewalls and bottom of the contact hole $H_{34}$. In a case where a conductive layer to be formed filling the contact hole $H_{34}$ in a subsequent process is a metal layer, the barrier metal layer 163 prevents metal atoms in the metal layer from diffusing into the interlayer insulating layers 145 and 160. The barrier metal layer 163 may be formed of a double layer of a Ti layer and a TiN layer. The double layer of a Ti layer and a TiN layer may be formed by CVD.

Next, a contact plug 165' is formed to contact the sidewalls and a predetermined portion of the top surface of the second SAC 155b and the isolation layer positioned at the same row as the second SAC 155b by filling the contact hole $H_{34}$ with a conductive material. The contact hole $H_{34}$ may be filled with W. In the prior art, the second SAC 55b is formed greater than the first SAC 55a, and thus a contact plug is formed to contact the surface of the second SAC 55b, as shown in FIGS. 2, 4A, and 4B. However, in the present invention, the contact plug 165' is formed to contact the sidewalls of the second SAC 155b as well as the top surface of the isolation layer 120, and thus the contact plug is electrically connected to the active regions 115. The contact plug 165' may be formed to have a larger size than the conventional contact plug. Next, a process for forming bit line described above with reference to FIGS. 10, 12A, and 12B may be performed.

A fifth illustrative embodiment of the present invention will now be described.

Figure 19:
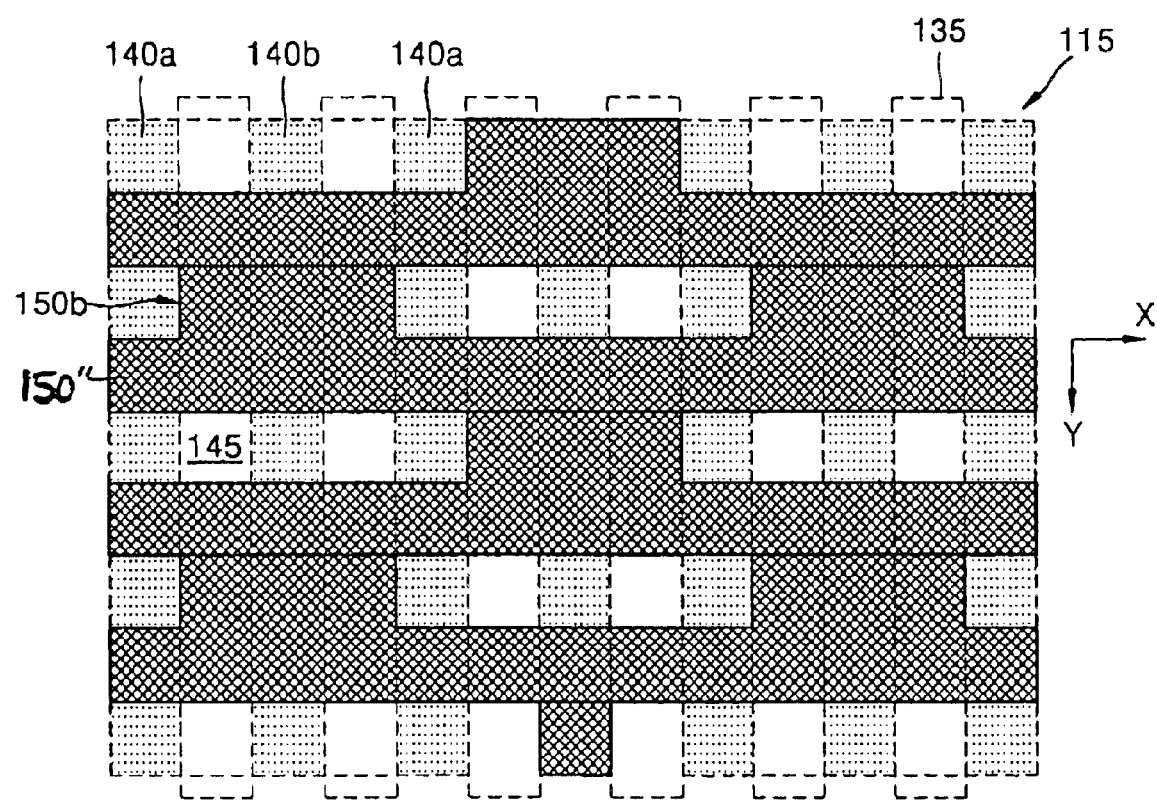
FIG. 19 is a plan view illustrating a semiconductor device according to a fifth embodiment of the present invention and a method for manufacturing the same.

FIG. 19 is a plan view illustrating a semiconductor device according to a fifth embodiment of the present invention and a method for manufacturing the same. The same reference numerals in the third and fifth embodiments represent the same elements. In addition, all processes of the fifth embodiment are the same as those of the third embodiment except for a process for forming photoresist patterns used to form SACs.

Referring to FIG. 19, the interlayer insulating layer 145 and underlying layers are formed like in the third embodiment. Next, photoresist patterns 150" are formed into a line shape at every row where the active regions 115 are not formed on the interlayer insulating layer 145 to extend in the direction X of the major axis of the active regions 115. In addition, the photoresist patterns 150" are formed to include protrusions 150b covering the top surface of the isolation layer 120 positioned at every row where the active regions 115 are formed. The protrusions 150b are formed to extend over the gates 135 positioned at either side of the isolation layer 120. Next, the processes described with reference to FIGS. 14, 15A, and 15B are performed. Subsequent processes may be the same as those of the fourth embodiment.

According to the present embodiment, as shown in FIG. 19, it is possible to obtain more sufficient room for a photoresist layer used to form the photoresist patterns 150" in a line shape and increase the thickness of the photoresist layer more considerably than the photoresist patterns 50 formed in an island shape. Accordingly, the photoresist patterns 150" can be prevented from being collapsed and the edge of each of the photoresist patterns 150" can be prevented from being deformed. Since the photoresist patterns 150" are formed in a line shape, contact holes can be formed to have the same size. Thus, the problem in the prior art with irregularly etched contact holes due to their different widths can be solved. In addition, since the edge of each of the photoresist patterns 150" can be prevented from being deformed by forming the photoresist patterns 150" in a line shape, adjacent SACs can be completely isolated from one another.

While this invention has been particularly shown and described with reference to preferred embodiments thereof, it will be understood by those skilled in the art that various changes in form and details may be made therein without departing from the spirit and scope of the invention as defined by the appended claims. For example, according to the embodiments of the present invention, the active regions are formed as single straight bars; however, the active regions may be formed in a T-shape. In a case where the active regions are formed in a T-shape, the third SACs are formed to contact the top surfaces of the active regions.

As described above, according to the present invention, photoresist patterns used to form SACs are formed in a line shape. Accordingly, it is possible to obtain more sufficient room for a photoresist layer and increase the thickness of the photoresist layer more considerably than the prior art. Thus, the photoresist patterns can be prevented from collapsing and the edge of each of the photoresist patterns can be prevented from being deformed. Accordingly, it is possible to realize the photoresist patterns much better than the prior art, and isolate adjacent SACs from one another.

In addition, all SACs are formed to have the same size. Accordingly, the problem of the prior art with irregularly etched contact holes due to their different widths can be solved, and thus it is possible to form SACs more reproducibly than the prior art.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor device, comprising:
    a semiconductor substrate;
    an isolation layer formed on the semiconductor substrate for defining a plurality of active regions, each of the plurality of active regions having a major axis and a minor axis;
    a plurality of gates formed to cross the plurality of active regions and extend in a direction of the minor axis of each of the plurality of active regions, each of the plurality of gates having a first side and a second side that are opposing and that run along the direction of the minor axis;
    a plurality of first and second source/drain regions formed in the plurality of active regions at either of the first side or the second side of each of the plurality of gates, each of the plurality of first and second source/drain regions having a top surface;
    a plurality of first self-aligned contact pads (SACs) and a plurality of second SACs formed to contact the top surface of each of the plurality of first and second source/drain regions, respectively, and wherein the plurality of first SACs and the plurality of second SACs have substantially the same top surface area; and
    a plurality of contact plugs each of the plurality of contact plugs formed to contact sidewalls and a predetermined portion of a top surface of one of the plurality of second SACs.

2. The semiconductor device of claim 1, wherein the plurality of gates are formed such that each two of the plurality of gates crosses one of the plurality of active regions.

3. The semiconductor device of claim 1, wherein the isolation layer has a top surface, and said semiconductor device further comprises a plurality of third SACs formed to contact areas of the top surface of the isolation layer that are disposed between adjacent first SACs in a direction of the major axis of each of the plurality of active regions.

4. The semiconductor device of claim 1, wherein an arrangement of the plurality of second SACs forms a plurality of columns, an arrangement of the plurality of first SACs and the plurality of second SACs forms a plurality of first rows having a plurality of second rows disposed in an alternating arrangement there between to isolate each of the plurality of first rows from one another, and the plurality of contact plugs, each of the plurality of contact plugs having a top surface, contact a portion of the top surface of the isolation layer, and wherein each of the plurality of contact plugs is positioned along one of the plurality of columns corresponding to one of the arrangements of the plurality of the second SACs; and the semiconductor device further comprises:
    a plurality of bit lines, wherein each of the plurality of bit lines are formed to contact the top surface of at least one of the plurality of contact plugs and extends in a direction of the major axis along the plurality of second rows where there is an absence of the plurality of active regions.

5. The semiconductor device of claim 4, wherein each of the plurality of contact plugs has sidewalls and a bottom surface, and said semiconductor device further comprises a metal barrier layer formed to surround the sidewalls and the bottom of each of the plurality of contact plugs.

6. The semiconductor device of claim 5, wherein the metal barrier layer is formed of a double layer comprising a Ti layer and a TiN layer.

7. The semiconductor device of claim 4, wherein each of the plurality of bit lines comprises a stacked body having a conductive recess-prevention layer, a bit line conductive layer, a bit line capping layer, sidewalls, and bit line spacers formed to surround the sidewalls of the stacked body.

8. The semiconductor device of claim 7, wherein the conductive recess prevention layer is formed of a double layer comprising a Ti layer and a TiN layer.

9. The semiconductor device of claim 4, further comprising:
    a plurality of third SACs, each of the plurality of third SACs having sidewalls and a top surface, and formed to respectively contact areas of the top surface of the isolation layer that are positioned along a same vertical axis as the plurality of first and second source/drain regions, wherein each of the plurality of contact plugs is formed to further contact the sidewalls and a predetermined portion of the top surface of one of the plurality of third SACs positioned along the same column as one of the plurality of second SACs, respectively.

10. A method for manufacturing a semiconductor device, comprising the steps of:
    forming an isolation layer on a semiconductor substrate, the isolation layer for defining a plurality of active regions, each of the plurality of active regions having a major axis and a minor axis;
    forming a plurality of gates on areas of the semiconductor substrate on which the isolation layer is formed, the plurality of gates formed to cross the plurality of active regions and extend in a direction of the minor axis of each of the plurality of active regions, each of the plurality of gates having a top surface and having a first side and a second side that are opposing and that run along the direction of the minor axis;
    forming a plurality of first and second drain/source regions in the plurality active regions at either of the first side or the second side of each of the plurality of gates, each of the plurality of first and second source/drain regions having a top surface;

forming a first interlayer insulating layer on regions of the semiconductor substrate on which the plurality of first and second source/drain regions are formed, the first interlayer insulating layer formed to completely fill spaces among the plurality of gates and to have a planarized top surface;

forming photoresist patterns in a line shape at each of a plurality of rows where there is an absence of any formation of the plurality of active regions on the first interlayer insulating layer, the line shape extending in a direction of the major axis;

etching the first interlayer insulating layer using the photoresist patterns as etching masks to form a plurality of contact holes through which the top surface of each of the plurality of first and second source/drain regions are respectively exposed;

removing the photoresist patterns;

forming a plurality of first self-aligned contact pads (SACs) and a plurality of second SACs to respectively contact the top surface of each of the plurality of first and second source/drain regions and to be level with the top surface of each of the plurality of gates, by filling the plurality of contact holes with a conductive material; and forming a second interlayer insulating layer on portions of the semiconductor substrate on which the plurality of first SACs and the plurality of second SACs are formed; and forming a plurality of contact plugs through the first and the second interlayer insulating layers to respectively contact the sidewalls and a predetermined portion of the top surface of each of the plurality of second SACs.

11. The method of claim 10, the plurality of gates are formed such that each two of the plurality of gates crosses one of the plurality of active regions.

12. The method of claim 10, wherein said step of forming the plurality of gates comprises the steps of:

sequentially forming a gate insulating layer, a gate electrode, and a capping layer on the areas of the semiconductor substrate on which the isolation layer is formed;

patterning the gate insulating layer, the gate electrode, and the capping layer to form a patterned gate insulating layer, a patterned gate electrode, and a patterned capping layer; and forming gate spacers to surround sidewalls of the patterned gate insulating layer, the patterned gate electrode, and the patterned capping layer, wherein the capping layer and the gate spacers are formed of an insulating material having a different etching selectivity from that of the first interlayer insulating layer.

13. The method of claim 10, comprising the step of forming a material layer that partially fills the spaces among the plurality of gates, subsequent to said step of forming the plurality of first and second source/drain regions, wherein the material layer is formed of an insulating layer having a different etching selectivity from that of the first interlayer insulating layer and is etched along with the first interlayer insulating layer.

14. The method of claim 10, wherein each of the plurality of the second SACs has sidewalls and a top surface, the isolation layer has a top surface, an arrangement of the plurality of second SACs forms a plurality of columns, an arrangement of the plurality of first SACs and the plurality of second SACs forms a plurality of first rows having a plurality of second rows disposed in an alternating arrangement there between to isolate each of the plurality of first rows from one another, and; plurality of contact plugs contact a portion of the top surface of the isolation layer, wherein each of the plurality of contact plugs are positioned along a same column as one of the arrangements of the plurality of second SACs, and said method further comprises the step of:

forming a plurality of bit lines, wherein each of the plurality of bit lines are formed alone one of the plurality of second rows and extends in a direction of the major axis of each of the plurality of active regions, and wherein the plurality of second rows are formed where there is an absence of the plurality of active regions.

15. The method claim 14, wherein said step of forming the plurality of contact plugs comprises the steps of:

etching the first and second interlayer insulating layers to form a plurality of contact holes, wherein each of the plurality of contact holes is formed to respectively expose there through the sidewalls and the predetermined portion of the top surface of one of the plurality of second SACs, and wherein the portion of the top surface of the isolation layer is positioned at the same one of the plurality of columns as the one of the plurality of second SACs and at one of the plurality of second rows that precedes or follows one of the plurality of first rows within which lies the one of the plurality of second SACs;

forming a conductive layer to completely fill each of the plurality of contact holes; and planarizing a top surface of the conductive layer to expose a top surface of the second interlayer insulating layer.

16. The method of claim 14, comprising the step of forming a barrier metal layer at sidewalls and a bottom surface of each of the plurality of contact holes, subsequent to said step of etching the first and second interlayer insulating layers.

17. The method of claim 16, wherein the barrier metal layer is formed of a double layer consisting of a Ti layer and a TiN layer.

18. The method of claim 14, further the step of forming a plurality of third SACS to respectively contact the top surface of the isolation layer positioned along a same horizontal axis as the plurality of first and second source/drain regions, wherein each of the plurality of contact plugs is formed to further contact sidewalls and a predetermined portion of each of the plurality of third SACS positioned at the same column as the one of the plurality of second SACs.

19. The method of claim 14, wherein the step of forming the plurality of bit lines comprises the steps of:

sequentially forming a conductive recess prevention layer, a bit line conductive layer, and a bit line capping layer on areas of the semiconductor substrate on which the plurality of contact plugs are formed;

patterning the conductive recess prevention layer, the bit line conductive layer, and the bit line capping layer to obtain a patterned conductive recess prevention layer, a patterned bit line conductive layer, and a patterned bit line capping layer; and forming bit line spacers to surround sidewalls of the patterned conductive recess prevention layer, the patterned bit line conductive layer, and the patterned bit line capping layer.

20. The method of claim 19, the conductive recess prevention layer is formed of a double layer consisting of a Ti layer and a TiN layer.

21. The method of claim 10, wherein each of the photoresist patterns are formed to include a protrusion covering the top surface of the isolation layer positioned at each of a plurality of rows where the plurality of active regions are formed.

22. The method of claim 21, wherein the protrusion covering the top portion of the isolation layer positioned at each of the plurality of rows where the active regions are formed is formed to extend over any of the plurality of gates.

* * * * *